United States Patent
Mueller et al.

(10) Patent No.: US 6,415,346 B1
(45) Date of Patent: Jul. 2, 2002

(54) PRE-CHARGING LOGIC CARDS FOR HOT INSERTION

(75) Inventors: Mark Wayne Mueller; Peter Matthew Thomsen; Lucinda Mae Walter, all of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/271,840

(22) Filed: Mar. 18, 1999

(51) Int. Cl.[7] .............................................. G06F 13/00
(52) U.S. Cl. ....................................................... 710/302
(58) Field of Search ................................. 710/101, 102, 710/103, 104, 300, 301, 302

(56) References Cited

U.S. PATENT DOCUMENTS

| | | | |
|---|---|---|---|
| 5,317,697 A | | 5/1994 | Husak et al. |
| 5,432,916 A | | 7/1995 | Hahn et al. |
| 5,515,515 A | * | 5/1996 | Kennedy et al. ............ 710/103 |
| 5,530,810 A | * | 6/1996 | Bowman .................... 710/103 |
| 5,644,731 A | * | 7/1997 | Liencres et al. ............ 710/103 |
| 5,712,754 A | | 1/1998 | Sides et al. .................... 361/58 |
| 5,774,315 A | | 6/1998 | Mussenden .................. 361/18 |
| 6,041,375 A | * | 3/2000 | Bass et al. ................... 710/103 |
| 6,157,974 A | * | 12/2000 | Gasparik ..................... 710/103 |

* cited by examiner

*Primary Examiner*—Glenn A. Auve
(74) *Attorney, Agent, or Firm*—Andrew J. Dillon

(57) ABSTRACT

A circuit card capable of live insertion into an activated electronic system includes a terminal edge from which an edge connector extends a first length. An input decoupling capacitance resides across the edge connector. A backplane within the activated electronic system receives the circuit card, wherein the backplane includes at least one voltage plane, a backplane receptor, and card guide receptor means. The backplane receptor electrically couples the edge connector to the voltage plane when the edge connector engages the backplane receptor. Card guide means are provided for guiding and connecting the circuit card into the backplane, and include at least one conductive member for engaging the card guide receptor means. The conductive member extends a second length from the terminal edge, wherein the second length is greater than the first length. At least one conductive path electrically couples the conductive member across the input capacitance. A voltage supply applied to the card guide receptor means ensures that during insertion of the circuit card into the backplane, but prior to the backplane receptor engaging the edge connector, the input capacitance will pre-charge through the conductive member, thereby preventing arcing and voltage dropout.

10 Claims, 3 Drawing Sheets

PRE-CHARGING LOGIC CARDS FOR HOT INSERTION

BACKGROUND OF THE INVENTION

1. Technical Field

The present invention relates in general to inserting circuit cards into activated systems. In particular, the present invention relates to a method and system for preventing voltage arcing and dropout resulting from initial insertion of a circuit card into an activated system. Still more particularly, the present invention relates to a method and system for providing a voltage source from which circuit card input capacitance may pre-charge, thus preventing arcing and voltage dropout when the card is initially inserted into an activated system.

2. Description of the Related Art

Various systems and methods for the rapid insertion of electronic subassemblies, such as printed circuit boards into a computer chassis, are known in the art. Typical methods utilized to minimize the impact of plugging into a live electronic system generally address the disruption to the bus signals to which a subassembly is being attached. Disruption to the power supply subsystems and subsequent electronic problems that this disruption causes is not generally addressed other than by deactivating or otherwise removing the power source before insertion can be accomplished.

A method and system for controlled removal and insertion of circuit modules into a system bus is known from U.S. Pat. No. 4,835,737. According to the teaching of this document, the operation of the bus is inhibited during the period that a module is being inserted into a connector connected to the bus, and the bus is reactivated after the module has been inserted. Quiescing of the bus in this manner, however, does not address power supply disturbances. In addition, there is no simple way to manage peripheral component operation during the interruption. Also, since subsystems within a digital system are often asynchronous with respect to each other, sequential operation errors become a significant possibility.

The so-called "hot plugging" concept provides power interconnects to a live system without causing interruption of ongoing data transfers in the rest of the system. Hot plugging is utilized in fault tolerant systems which normally include device or field replaceable unit redundancy coupled through operational comparison and checking logic to ensure correct operation. Both the bus design and the control device must be carefully designed to achieve this "hot plugging" capability.

A representative system for facilitating hot plugging of circuit cards into activated electronic systems is described in U.S. Pat. No. 5,432,916, issued Jul. 11, 1995, to Hahn et al. The design described in this document, as well as other current hot plug protection designs, focus primarily on preventing transients to the extent that signal switching is not so adversely affected. Hahn et al. teach a system by which electrical transients resulting from hot plugging are reduced by managing the transient load on the driver of the port of the active system in which the electrical circuit is to be hot plugged. The management of transients is accomplished in part by staggering connection means at the input/output (I/O) ports of the electrical circuit and adding so-called "preconditioning" impedance networks within the signal network of the circuit. This hot plug management technique, however, only addresses transients on the signal bus.

SUMMARY OF THE INVENTION

It is therefore one object of the present invention to provide an improved method and system for inserting circuit cards into activated systems.

It is another object of the present invention to provide a method and system for preventing voltage arcing and dropout resulting from initial insertion of a circuit card into an activated system.

It is yet another object of the present invention to provide a method and system for providing a voltage source from which input capacitance of a circuit card may pre-charge, thus preventing arcing and voltage dropout when the card is initially inserted into an activated system.

The foregoing objects are achieved as is now described. A circuit card capable of live insertion into an activated electronic system includes a terminal edge from which an edge connector extends a first length. An input decoupling capacitance resides across the edge connector. A backplane within the activated electronic system receives the circuit card, wherein the backplane includes at least one voltage plane, a backplane receptor, and card guide receptor means. The backplane receptor electrically couples the edge connector to the voltage plane when the edge connector engages the backplane receptor. Card guide means are provided for guiding and connecting the circuit card into the backplane, and include at least one conductive member for engaging the card guide receptor means. The conductive member extends a second length from the terminal edge, wherein the second length is greater than the first length. At least one conductive path electrically couples the conductive member across the input capacitance. A voltage supply applied to the card guide receptor means ensures that during insertion of the circuit card into the backplane, but prior to the backplane receptor engaging the edge connector, the input capacitance will pre-charge through the conductive member, thereby preventing arcing and voltage dropout.

DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Modern computer systems such as those found within multi-tasking server networks require maximum fault tolerance. When a fault is detected in such a system the defective logic card must be replaced while the system is running. Transient disturbances caused by current arcing and voltage dropout during live insertion, are a source of problems for the operation as well as the electrical behavior of the system. In particular, current arcing at the interconnection interface may cause the supply voltage level to drop below allowable limits (commonly referred to in the art as "voltage dropout"), thus resulting in system disturbances and associated logical errors. The present invention addresses the problem of the voltage arcing and voltage dropout that occur when an electronic subassembly, such as a circuit card, is inserted into an activated system.

A significant source of such transient disturbances occurs when a "dead" card is inserted into a live system. The decoupling capacitors on the circuit card (referred to interchangebly hereinafter as "input capacitance"), when presented with an instantaneous voltage across them during insertion into the system, act as a momentary short circuit. The result is an enormous inrush of current and associated dropout of the voltage on the backplane into which the card is inserted. Since the capacitors are initially at zero potential, they present so an instantaneous short circuit to the supply voltage until they are charged to the level of the supply.

The system and method of the present invention provide a means to pre-charge the capacitors such that they are at the supply voltage potential before the circuits engage so that the system power supply voltage levels are not adversely affected by insertion of the card.

Figure 1:
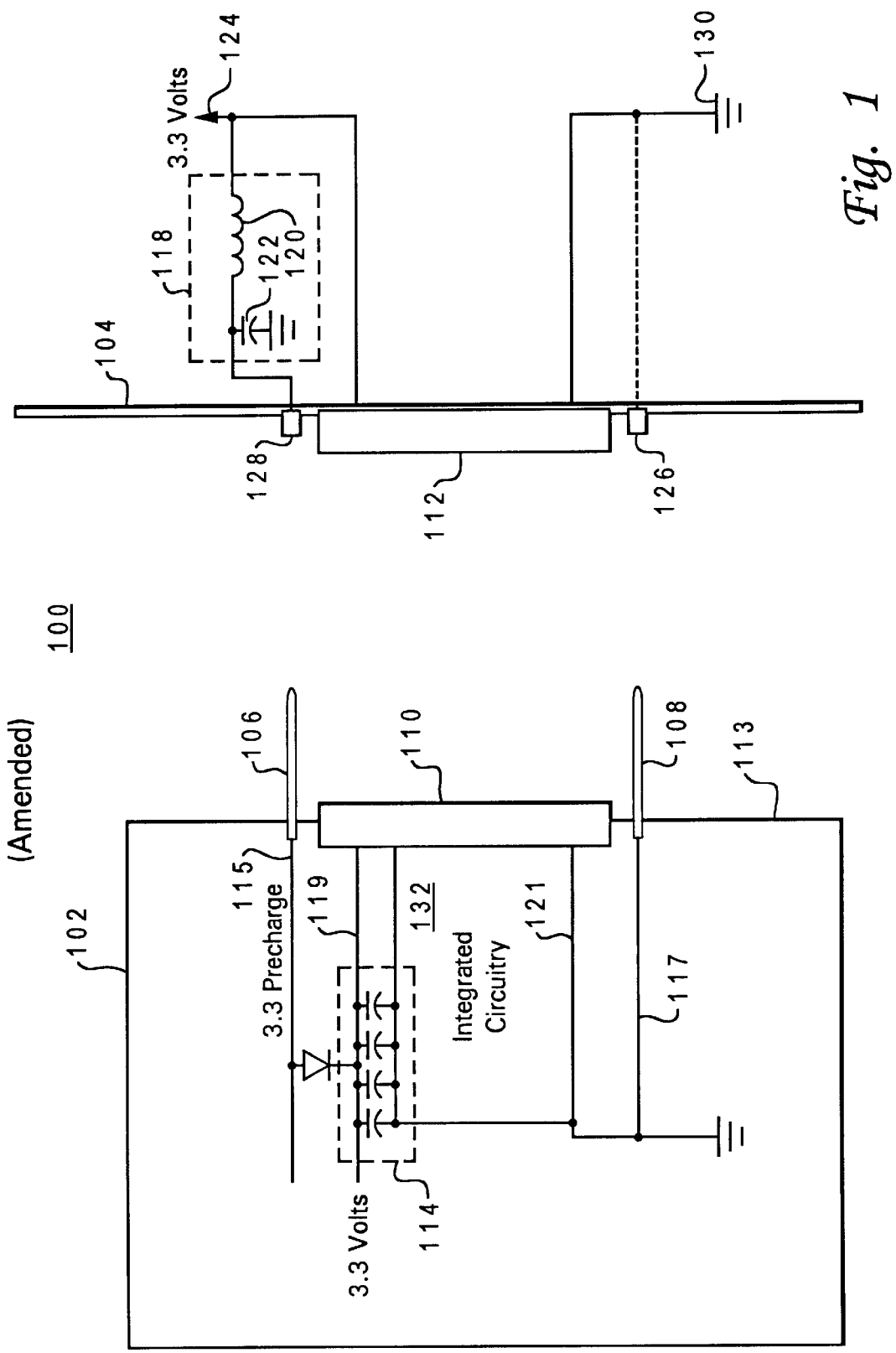
FIG. 1 is a schematic representation of the pre-charge system in accordance with one embodiment of the present invention.

Implementation of the system and method of the present invention results in a reduction of the magnitude of the inrush current to an acceptable level, such that the main power supplies and decoupling can adequately compensate and react. In a preferred embodiment of the present invention, this "throttling " of the inrush current is accomplished by pre-charging the decoupling capacitance through surge suppression means. The present invention thus slows the current inrush response, thereby reducing the initial current surge and also allowing sufficient time for the desired pre-charge to complete. This pre-charging should be accomplished as the card is being inserted into the system, making it transparent to the end user. Typical connectors provide varying length pins, usually only a few millimeters different in length. This is not a sufficient length differential to assure the pre-charging time needed—only a few milliseconds as opposed to tens of milliseconds. The system and method of the present invention utilize card guide means (in the form of conductive posts or pins) to implement this pre-charge function, as they make contact several tens of millimeters before any other connector contact is made. The figures described hereinbelow illustrate and further describe the overall pre-charge scheme implemented in accordance with one embodiment of the present invention. It should be further noted that the surge suppression circuitry utilized to pre-charge the circuit card may be detrimental to the steady state operation of card circuitry since it does not allow instantaneous response to the changing voltage requirements of such circuitry. Therefore, the surge suppression circuitry must be disabled when the card is fully engaged. As depicted in FIG. 1 below, this is accomplished by shorting the voltage planes together.

With reference now to the figures and in particular with reference to FIG. 1, there is depicted a simplified schematic representation of a pre-charge system 100 in accordance with one embodiment of the present invention. As seen in FIG. 1, pre-charge system 100 is comprised of a combination of devices and entities located on both a circuit card 102 and a backplane 104 into which circuit card 102 may be hot plugged. Circuit card 102 includes integrated circuitry 132 and a circuit card edge connector 110 which is attached to the terminal edge 113 of circuit card 102. It will be understood by those skilled in the art that edge connector 110 may be any one of a variety of specific types of edge connectors. In the embodiment depicted, it is contemplated that edge connector 110 includes a plurality of card pins extending a fixed, equal length from terminal edge 113. Although not depicted, these card pins serve as inputs into the integrated circuitry within block 132. In accordance with the teachings of the present invention, the pins within edge connector 110 also serve as an input for power and ground supply planes 119 and 121.

Integrated circuit cards such as circuit card 102 often have a substantial rail-to-rail decoupling capacitance. Such a decoupling capacitance (referred to alternatively as "input capacitance"), is depicted in FIG. 1 as a bank of capacitors 114 residing within circuitry 132 across power plane 119 and ground plane 121. Although depicted within block 132 as comprising four capacitors, it will be appreciated and understood by those skilled in the art that any number of capacitors, capacitive elements, etc. may be included within capacitor bank 114 depending on the nature of the circuitry within block 132. If circuit card 102 is a memory card, for example, the amount of capacitance on power plane 119 will be in the hundreds to thousands of microfarads. In this example it can be seen that the capacitance within capacitor bank 114 will be felt across corresponding pins within edge connector 110.

Also attached to and extending from terminal edge 113, are card guide connection members 106 and 108 which, in conventional configurations, serve only to guide and fasten circuit card 102 to backplane 104. The system and method of the present invention require that connection members 106 and 108 themselves be conductive and be electrically coupled across capacitor bank 114 via conductive paths 115 and 117. Conductive paths 115 and 117 are placed onto or within circuit card 102 utilizing standard printed circuit techniques. As an important feature of the present invention, it should be noted that connection members 106 and 108 extend from terminal edge 113 well beyond edge connector 110. This feature is important in implementing the system and method of the present invention as described in greater detail below.

Backplane 104 includes a backplane receptor 112 and card guide receptors 128 and 126 for mechanically and electrically receiving circuit card 102. A voltage supply plane 124 and a ground plane 130 provide power and ground to backplane 104. Backplane 104 is utilized in pre-charge system 100, to removably engage a circuit card such as circuit card 102. Backplane 104 includes backplane receptor 112 that engages edge connector 110 and thus connects integrated circuitry 132 to signal buses (not depicted) and power and ground planes 124 and 130. In this manner, voltage and ground planes 124 and 130 are applied directly to corresponding power and ground planes 119 and 121 within circuit block 132 when backplane receptor 112 engages edge connector 110 when circuit card 102 has been fully inserted into backplane 104. In the embodiment depicted, backplane 104 also includes a pair of conductive card guide receptors 128 and 126. Card guide receptor 128 is electrically coupled to voltage supply plane 124, which in the depicted embodiment, provides a 3.3 volt supply.

The depicted embodiment includes a surge suppresser 118 that provides a current surge buffer between voltage supply plane 124 and card guide receptor 128. In the depicted embodiment, surge suppresser 118 is comprised of an inductor 120 and a decoupling capacitor 122. Inductor 120 provides a current surge buffer function whose purpose is two-fold. First, the buffer limits the magnitude of a current surge from voltage supply plane 124, thereby minimizing arcing between card guide receptor 128 and connection member 106. Second, by limiting the current drawn at a given instant in time, the voltage level of voltage supply plane is prevented from dropping out of specified limits. It will be understood by those skilled in the art that the simple inductance configuration depicted within surge suppresser 118, may in alternate embodiments, be replaced by more complex surge protection circuitry including both active and passive devices such as transistors and resistors.

To effect the time delayed and buffered pre-charge function of the present invention, connection members 106 and 108 must contact corresponding card guide receptors 128 and 126 prior to edge connector 110 engaging backplane receptor 112. To ensure adequate pre-charge duration, and in a preferred embodiment of the present invention, the time span between engagement of the mutually offset contacts will be on the order of at least tens of milliseconds. In this manner, when circuit card 102 is initially inserted into backplane 104, capacitor bank 114 will be charged in a controlled manner to the voltage level of voltage supply plane 124 (3.3 volts in the depicted example). By providing a buffered input voltage source to accommodate the initial current demands of capacitor bank 114 prior to connecting of circuit block 132 to voltage supply plane 124, the magnitude of inrush current from voltage supply plane 124 is held to an acceptable level, thereby avoiding current arcing and voltage dropout that would otherwise occur on voltage supply plane 124.

Figure 2:
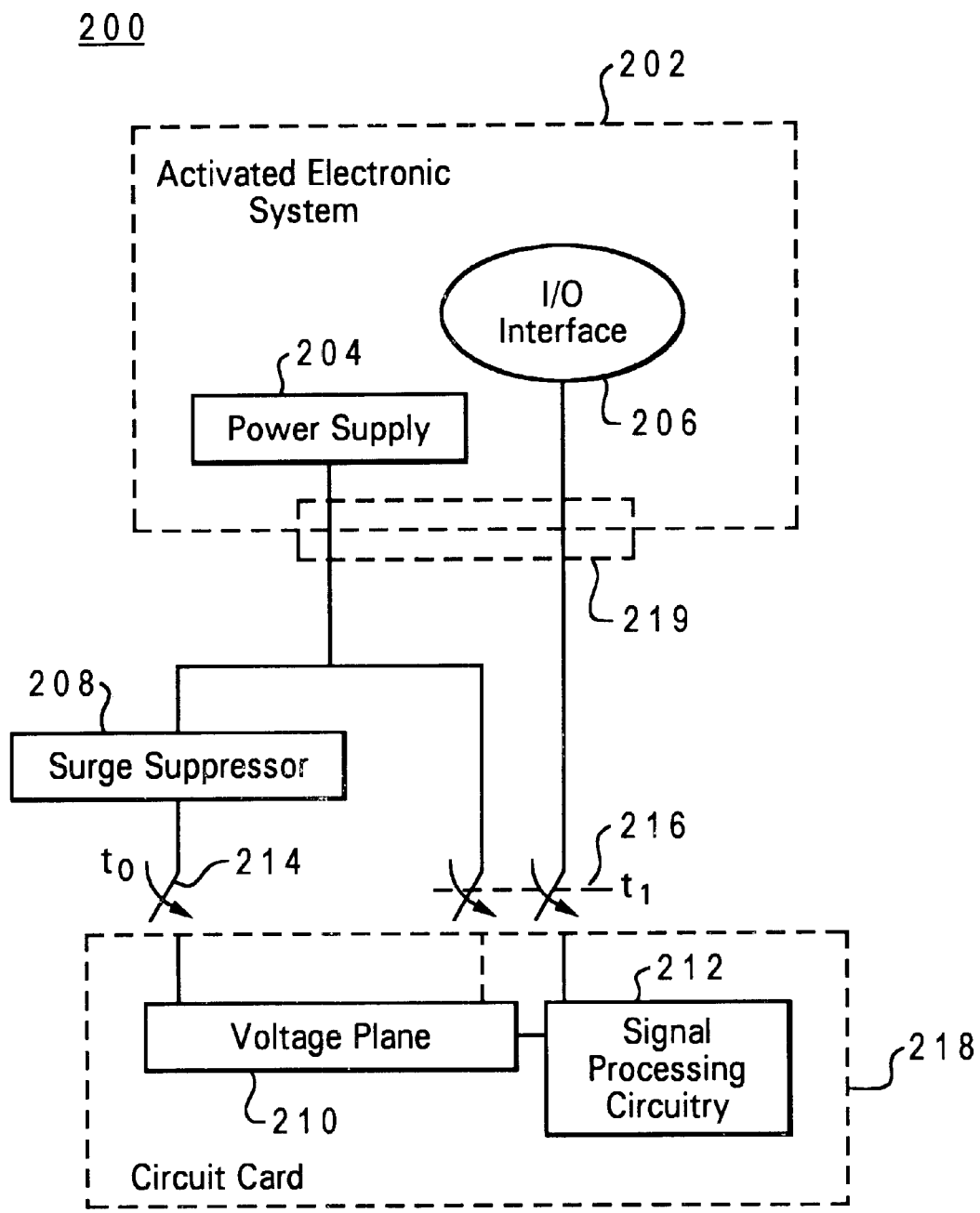
FIG. 2 illustrates a generalized block diagram of a pre-charge system in accordance with the present invention.

With reference now to FIG. 2 there is illustrated a simplified block diagram comprising a pre-charge system 200 in accordance with the teachings of the present invention. As seen in the depicted example, pre-charge system 200 includes component devices that may reside on either or both of an activated electronic system 202 and a circuit card 218 that may be hot plugged into a backplane interface 219 within electronic system 202. The system and method of the present invention include two characteristic features that prevent arcing and voltage dropout during insertion of a circuit card with a high value of input capacitance, such as a memory card, to be inserted into a live system such as electronic system 202.

The first pre-charge feature depicted in FIG. 2 is the time difference between when the input capacitance residing on voltage plane 210 is pre-charged, and when the entire circuit card circuitry is placed on line. It is preferred that the time differential between $t_0$ and $t_1$ be from at least 10 milliseconds to permit adequate time for the capacitance residing on voltage plane 210 to fully charge prior to switch 216 closing. It should be noted that within the description of pre-charge system 200, reference to the physical embodiment depicted in FIG. 1 are intended as illustrative aids only. Those skilled in the art will appreciate that many other possible configurations of devices may be utilized to implement the pre-charge function depicted in FIG. 2 without departing from the spirit or scope of the present invention.

As explained with reference to FIG. 1, conductive connection members are constructed on the terminal edge of circuit card 218, such that prior to full insertion of circuit card 218, the connection members electrically contact conductive card guide receptors. This initial contact between circuit card 218 and the backplane within electronic system 202 is represented by switch 214 closing at time $t_0$. The remaining signal processing circuitry 212 residing on circuit card 218, is finally coupled into a backplane receptor within electronic system 202 when an edge connector, such as edge connector 110, contacts the live backplane receptor, as represented by switch 216 closing at time $t_1$. The contact represented by the closing of switch 214 at $t_0$, will occur substantially prior to time $t_1$ due to the substantial difference in the length of extension from the edge of circuit card 218 between the connection members and the edge connector. In the embodiment depicted in FIG. 2, a surge suppresser 208 is utilized to buffer the pre-charge current from power supply 204 to voltage plane 210. This buffering will commence at time $t_0$ and terminate at time $t_1$. It should be noted that the placement of surge suppresser 208 outside electronic system 202 and circuit card 218, is for illustrative purposes only, and that an actual implementation of the present invention, the components comprising surge suppressor 208 may be placed within either or divided between both. It should also be noted that in a preferred embodiment, the time span commencing at $t_0$ and terminating at $t_1$ will be at least 10 and no more than 100 milliseconds.

Figure 3:
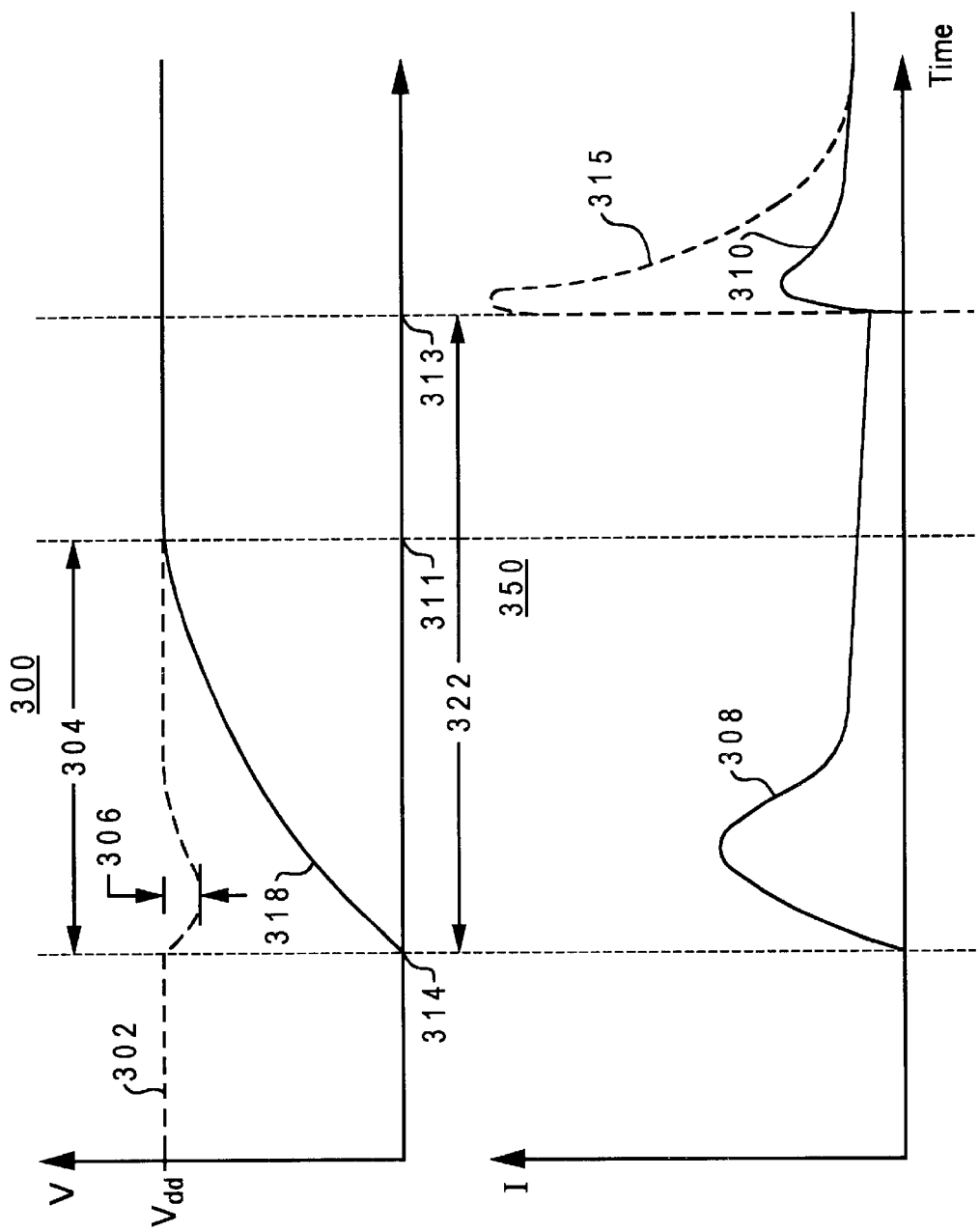
FIG. 3 is a graphical representation of the pre-charge and power supply response, in terms of voltage and current levels of the pre-charge system depicted in FIG. 2.

Turning now to FIG. 3, graphical representations of voltage and current responses from pre-charge system 200 are depicted. The response curves illustrated in FIG. 3 demonstrate the sequence of events resulting from the is addition of pre-charge system 200 to the system to be hot plugged. As seen in FIG. 3, voltage response 300 includes a pre-charge voltage curve 318 superimposed on the same timeline with a voltage supply level curve 302. Pre-charge voltage curve represents the relative voltage level as seen across the input capacitance of circuit card 218. Voltage supply curve 302 illustrates the voltage level residing on power supply 204 before, during, and after insertion of circuit card 218. Time 314 marks the commencement of the events represented by switch 214 closing at $t_0$ (connection members 106 and 108 contact card guide receptors 128 and 126). Pre-charge curve 318 commences from that point in a logarithmic manner until it is equal to voltage supply level 302 at time 311. Time 311 therefore depicts the point in time so at which the input capacitance of circuit card 218 has been fully charged.

A current response timeline 350 includes a pre-charge current response 308 and a steady state circuit card current 310. Pre-charge current response curve 308 represents the current response drawn from power supply 208 into input capacitance within voltage plane 210. Pre-charge current response curve corresponds to the pre-charging events described above. The system of the present invention limits the peak magnitude of a current surge from power supply 204 to prevent excessive voltage dropout. It should be noted that a slight drop in power supply voltage occurs during the pre-charge phase as depicted by voltage drop 306. Most computer systems are designed to tolerate slight deviations without disruption of the system however.

It is not until time 313 that the circuit card edge connector contacts the backplane receptor. Beginning at time 313, signal processing circuitry 212 will draw steady state current level 310 that is well below that required to cause arcing or voltage dropout. A current spike 315 is superimposed on the same timeline to demonstrate the relative magnitude and rapid rise time of the inrush current that would be experienced by power supply 204 in the absence of the pre-charge function of the present invention.

The system and method of the present invention produce the benefits that result when electrical transients caused by hot plugging of a high capacitance circuit card into an electronic system with limited current supply capabilities are properly managed. In this manner, the present invention addresses the root causes of electrical insertion transients by managing the time sequence over which the input capacitance of a card is charged and also providing a surge suppresser to prevent arcing.

While the invention has been particularly shown and with reference to a preferred embodiment, it will be understood by those skilled in the art that various changes in form and detail may be made therein without departing from the spirit and scope of the invention.

What is claimed is:

1. A circuit card that may be hot plugged into a backplane of a live electronic system without interrupting a power supply within said electronic system, wherein said backplane includes a backplane receptor for electrically engaging functional circuitry within said circuit card, said circuit card comprising:

a terminal edge having an edge connector that includes functional circuit contacts for engaging power and signal contacts within said backplane receptor, wherein said functional circuit contacts extend a first length with respect to said terminal edge, said circuit card having an input capacitance across said edge connector, card guide means situated outside the boundaries of said edge connector for guiding and connecting said circuit card into said backplane, said card guide means including at least one conductive member for engaging card guide receptor means situated outside of said backplane receptor within said backplane, said at least one conductive member extending a second length beyond said terminal edge, wherein said second length is greater than said first length; and at least one conductive path for electrically coupling said at least one conductive member across said input capacitance.

2. The circuit card of claim 1, further comprising current surge suppression means for providing a buffer between said at least one conductive member and said input capacitance, wherein said current surge suppression means includes at least one inductive element.

3. The circuit card of claim 1, wherein said second length exceeds said first length by at least ten millimeters.

4. An apparatus for pre-charging an input capacitance of a circuit card during insertion of said circuit card into an activated electronic system, said apparatus comprising:

a circuit card having a terminal edge on which an edge connector resides, wherein said edge connector includes functional circuit contacts for engaging power and signal contacts within a backplane receptor within said activated electronic system, said functional circuit contacts extending a first length with respect to said terminal edge, said circuit card having an input capacitance across said edge connector;

a backplane within an activated electronic system for receiving said circuit card, wherein said backplane includes at least one voltage plane, said backplane receptor, and card guide receptor means that reside outside said backplane receptor, wherein said backplane receptor electrically couples said edge connector to said at least one voltage plane when said edge connector engages said backplane receptor;

card guide means situated outside said edge connector on said terminal edge for guiding and connecting said circuit card into said backplane, said card guide means including at least one conductive member for engaging said card guide receptor means, said at least one conductive member extending a second length beyond said terminal edge, wherein said second length is greater than said first length;

at least one conductive path for electrically coupling said at least one conductive member across said input capacitance; and a voltage supply applied to said card guide receptor means, such that during insertion of said circuit card into said backplane and prior to said backplane receptor engaging said edge connector, said input capacitance will pre-charge through said at least one conductive member.

5. The apparatus of claim 4, wherein said voltage supply comprises said voltage plane and current surge suppression means including at least one inductive element electrically connected between said voltage plane and said card guide receptor means.

6. The apparatus of claim 5, wherein said inductive element is characterized as among a group consisting of inductors and ferrite beads.

7. The apparatus of claim 4, wherein said circuit card further comprises a power plane and a ground plane across which said input capacitance resides.

8. The apparatus of claim 4, wherein said edge connector includes a plurality of card pins extending a length equal to said first length from said terminal edge.

9. The apparatus of claim 4, wherein said voltage supply comprises said voltage plane and surge suppression means electrically connected between said at least one conductive member and said input capacitance.

10. The apparatus of claim 4, wherein said second length exceeds said first length by at least ten millimeters.

* * * * *